(12) United States Patent
Nishikawa et al.

(10) Patent No.: US 6,847,355 B1
(45) Date of Patent: Jan. 25, 2005

(54) HIGH-RELIABILITY TOUCH PANEL

(75) Inventors: Kazuhiro Nishikawa, Kyoto (JP); Takao Hashimoto, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 408 days.

(21) Appl. No.: 09/959,918

(22) PCT Filed: Jun. 13, 2000

(86) PCT No.: PCT/JP00/03826

§ 371 (c)(1),
(2), (4) Date: Nov. 13, 2001

(87) PCT Pub. No.: WO00/79475

PCT Pub. Date: Dec. 28, 2000

(30) Foreign Application Priority Data

Jun. 17, 1999 (JP) ............................................ 11-170711

(51) Int. Cl.[7] ............................ G09G 5/00; G06K 11/06
(52) U.S. Cl. .................. 345/173; 178/18.01; 178/18.03
(58) Field of Search .................................. 345/173–178, 345/182; 315/169.1; 178/18.01–18.9; 428/76; 349/12

(56) References Cited

U.S. PATENT DOCUMENTS 4,644,101 A * 2/1987 Jin et al. .................. 178/18.05
5,474,828 A * 12/1995 Kouyama et al. .............. 428/76
6,204,896 B1 * 3/2001 Matsuhira et al. ............ 349/12
6,577,068 B2 * 6/2003 Matsueda ................. 315/169.1

FOREIGN PATENT DOCUMENTS

| EP | 0 372 880 | 6/1990 | |
| EP | 1 030 333 | 8/2000 | |
| JP | 4-147526 | * 10/1990 | .......... H01H/13/76 |
| JP | 8-336855 | * 12/1996 | .......... B29C/45/00 |
| WO | 99/19893 | 4/1999 | |

* cited by examiner

*Primary Examiner*—Chanh Nguyen
*Assistant Examiner*—Uchendu O. Anyaso
(74) *Attorney, Agent, or Firm*—Wenderoth, Lind & Ponack, L.L.P.

(57) ABSTRACT

In the touch panel of an analog resistance film form having independent connection electrodes to be connected via a conductive adhesive (5) to lead electrodes (13,14) set to an opposing panel, the conductive adhesive is made up of a main conductive filler (51) of flakes or spheres of a particle size of 1–20 $\mu$m or short fibers of a length of 1–20 $\mu$m and a spherical auxiliary conductive filler (52) having an insulating core material (52a) coated with a conductive layer (52b) and a larger particle size by 10–100 $\mu$m than a minimum distance of contact faces of the electrodes, both fillers dispersed in a binder, whereby the auxiliary conductive filler is always kept in touch with the lead electrodes and connection electrodes.

16 Claims, 5 Drawing Sheets

HIGH-RELIABILITY TOUCH PANEL

TECHNICAL FIELD

The present invention relates to a touch panel arranged on a screen of an LCD (liquid crystal display), a CRT (cathode ray tube), or the like to provide position inputs when pressed from above by a finger, a pen or the like in accordance with instructions seen through the screen, and more particularly to a touch panel of a high reliability in electric connection by a conductive adhesive, and a touch panel manufacturing method for manufacturing the touch panel.

BACKGROUND ART

There has conventionally been used a touch panel of an analog resistance film form in electronic diaries, personal computers, etc. In the touch panel, as shown in FIG. 9, a touch side panel 101 with flexibility and a base side panel 102 are faced to each other via an insulating spacer 103. The above panels have transparent electrodes 112, 122 and pairs of parallel lead electrodes (named also as bus bars) 113, 114, 123, 124 set to respective one faces of transparent insulating base members 111, 121, and moreover the lead electrodes 113, 114, 123, 124 being disposed in a rectangular arrangement with the lead electrodes of both the panels in a state with the transparent electrodes 112, 122 being placed inside. Either one of the touch side panel and the base side panel has the transparent electrode set to the entire face of the transparent insulating base member thereon, whereas the other has the transparent electrode set to a part of the transparent insulating base member thereon while independent connection electrodes 115, 116 are mounted at insulating parts other than the transparent electrode so as to connect the independent connection electrodes by conductive adhesives 105 to the lead electrodes of the counterpart panel. In FIGS. 9 and 10, reference numeral 104 denotes a dot-shaped spacer, 131 a space part, 132 and 133 through hole parts, and 153 a binder.

The conductive adhesives 105 is a commercially available one such as obtained by dispersing a conductive filler 154 of flakes or spheres of a particle size of 1–20 μm or short fibers of a length of 1–20 μm, or the like, which is applied by a dispenser or the like. A heat treatment or the like is carried out in conformity with a set condition of a resin as a binder of the conductive adhesive 105 after the touch side panel 101 is bonded to the base side panel 102.

In the prior art, an out gas generated from a volatile solvent of the conductive adhesive 105 at the time of setting the conductive adhesive has caused lifting between the lead electrodes 123, 124 and the conductive adhesive 105 and/or between the connection electrodes 115, 116 and the conductive adhesive 105, or a stress of thermal expansion or thermal shrinkage of the touch side panel 101 and base side panel 102 at an environment resistance test has caused similar lifting, leading in some cases to a continuity failure because of a void 170 defined by the lifting (referring to FIG. 10). Especially, when a center part of the touch panel is pressed by a pen or finger, an upward force tends to generate at edges of the touch panel, thus easily causing lifting between the lead electrodes 123, 124 and the conductive adhesive 105 and/or between the connection electrodes 115, 116 and the conductive adhesive 105. Moreover, the materials of the touch side panel and the base side panel are a film and a glass different from each other, easily causing a stress of thermal expansion, thermal shrinkage of the touch side panel 101 and base side panel 102.

DISCLOSURE OF INVENTION

The present invention is devised to solve the aforementioned issues and has for its object to provide a high-reliability touch panel and a touch panel manufacturing method for manufacturing the touch panel which are never associated with a continuity failure even in the event of some lifting between a lead electrode and a conductive adhesive and/or between a connection electrode and the conductive adhesive.

In accomplishing these and other aspects, according to a first aspect of the present invention, there is provided a touch panel comprising:

a flexible touch side panel and a base side panel arranged to face each other via an insulating spacer in an analog resistance film form;

a transparent electrode and a pair of parallel lead electrodes provided onto one face of a transparent insulating base member of each of the panels in a state with the transparent electrode set inside and the lead electrodes of one of the panels disposed in a rectangular arrangement along with the lead electrodes of the counterpart panel, either one of the touch side panel and the base side panel having the transparent electrode set to an entire face of the transparent insulating base member thereof, the other having the transparent electrode set to part of the transparent insulating base member thereof and including, at an insulating part other than the transparent electrode, independent connection electrodes; and a conductive adhesive for connecting the connection electrodes set to one of the panels to the lead electrodes set to the opposing panel, the conductive adhesive being made up of main conductive fillers of flakes or spheres or short fibers, and a spherical auxiliary conductive filler having an insulating core material coated with a conductive layer and having a larger particle size by 10–100 μm than a minimum distance of contact faces of the lead electrode of one of the panels and the connection electrode of the other of the panels connected by the conductive adhesive, both of the main conductive fillers and the auxiliary conductive filler dispersed in a binder of the conductive adhesive, whereby the auxiliary conductive filler is always kept in touch with the lead electrode of the one of the panels and the connection electrode of the other of the panels.

According to a second aspect of the present invention, there is provided a touch panel according to the first aspect, wherein a size of each of the main conductive fillers is 1/300 to 1/2 of that of the auxiliary conductive filler.

According to a third aspect of the present invention, there is provided a touch panel according to the first or second aspect, wherein the conductive adhesive is made up of the main conductive fillers of flakes or spheres of a particle size of 1–20 μm or short fibers of a length of 1–20 μm.

According to a fourth aspect of the present invention, there is provided a touch panel according to any one of the first through third aspects, wherein the main conductive fillers are silver powder of flakes.

According to a fifth aspect of the present invention, there is provided a touch panel according to any one of the first through fourth aspects, wherein the auxiliary conductive filler has an insulating resin core material as the core material which is coated with the conductive layer formed of gold.

According to a sixth aspect of the present invention, there is provided a touch panel according to any one of claims the first through fifth aspects, wherein a content of the auxiliary conductive filler in the conductive adhesive when formed into an ink is 0.5–30 wt % to the conductive adhesive.

According to a seventh aspect of the present invention, there is provided a touch panel according to any one of the first through sixth aspects, wherein the spacer has through hole parts, into which the conductive adhesive is inserted to connect the connection electrodes set to one of the panels to the lead electrodes set to the opposing panel.

According to an eighth aspect of the present invention, there is provided a touch panel according to any one of the first through seventh aspects, wherein a viscosity of the conductive adhesive ranges from 100 Poise to 600 Poise, and includes a plurality of the auxiliary conductive fillers having a specific gravity of 1–5.

According to a ninth aspect of the present invention, there is provided a touch panel manufacturing method comprising:

arranging a flexible touch side panel and a base side panel to face each other via an insulating spacer in an analog resistance film form, a transparent electrode and a pair of parallel lead electrodes being provided onto one face of a transparent insulating base member of each of the panels in a state with the transparent electrode set inside and the lead electrodes of one of the panels disposed in a rectangular arrangement along with the lead electrodes of the counterpart panel, either one of the touch side panel and the base side panel having the transparent electrode set to an entire face of the transparent insulating base member thereof, the other having the transparent electrode set to part of the transparent insulating base member thereof and including, at an insulating part other than the transparent electrode, independent connection electrodes; and connecting, via a conductive adhesive, the connection electrodes set to one of the panels to the lead electrodes set to the opposing panel, the conductive adhesive being made up of main conductive fillers of flakes or spheres or short fibers, and a spherical auxiliary conductive filler having an insulating core material coated with a conductive layer and having a larger particle size by 10–100 μm than a minimum distance of contact faces of the lead electrode of one of the panels and the connection electrode of the other of the panels connected by the conductive adhesive, both of the main conductive fillers and the auxiliary conductive filler dispersed in a binder of the conductive adhesive, whereby always keeping the auxiliary conductive filler in touch with the lead electrode of the one of the panels and the connection electrode of the other of the panels.

According to a tenth aspect of the present invention, there is provided a touch panel manufacturing method according to the ninth aspect, wherein a size of each of the main conductive fillers is 1/300 to 1/2 of that of the auxiliary conductive filler.

According to an eleventh aspect of the present invention, there is provided a touch panel manufacturing method according to the ninth or tenth aspect, wherein the conductive adhesive is made up of the main conductive fillers of flakes or spheres of a particle size of 120 μm or short fibers of a length of 1–20 μm.

According to a twelfth aspect of the present invention, there is provided a touch panel manufacturing method according to any one of the ninth through 11th aspects, wherein the main conductive fillers are silver powder of flakes.

According to a 13th aspect of the present invention, there is provided a touch panel manufacturing method according to any one of the ninth through 12th aspects, wherein the auxiliary conductive filler has an insulating resin core material as the core material which is coated with the conductive layer formed of gold.

According to a 14th aspect of the present invention, there is provided a touch panel manufacturing method according to any one of the ninth through 13th aspects, wherein a content of the auxiliary conductive filler in the conductive adhesive when formed into an ink is 0.5–30 wt % to the conductive adhesive.

According to a 15th aspect of the present invention, there is provided a touch panel manufacturing method according to any one of the ninth through 14th aspects, wherein in connecting, via the conductive adhesive, the connection electrodes set to one of the panels to the lead electrodes set to the opposing panel, the conductive adhesive is inserted into through hole parts of the spacer to connect the connection electrodes set to one of the panels to the lead electrodes set to the opposing panel.

According to a 16th aspect of the present invention, there is provided a touch panel manufacturing method according to any one of the ninth through 15th aspects, wherein a viscosity of the conductive adhesive ranges from 100 Poise to 600 Poise, and includes a plurality of the auxiliary conductive fillers having a specific gravity of 1–5.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
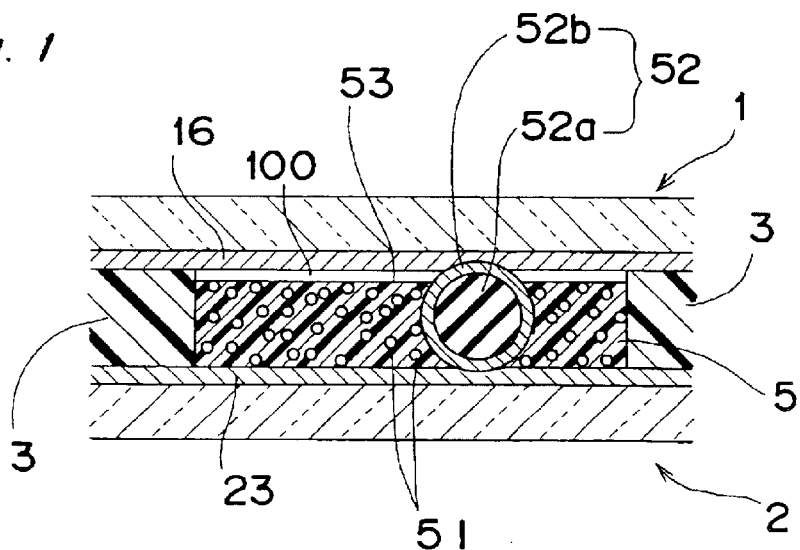
FIG. 1 is a diagram explanatory of electric connection of a touch panel according to an embodiment of the present invention by a conductive adhesive with a void caused by out gas and the main conductive fillers being spheres.

Before the description of the present invention proceeds, it is to be noted that like parts are designated by like reference numerals throughout the accompanying drawings.

A touch panel and a touch panel manufacturing method for manufacturing the touch panel according to embodiments of the present invention will be described in detail with reference to the drawings.

Figure 2:
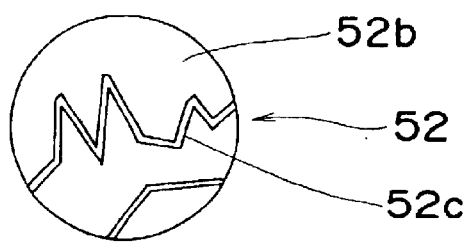
FIG. 2 is an enlarged diagram explanatory of the reason why an auxiliary conductive filler is not solely used in the touch panel of FIG. 1.
Figure 3:
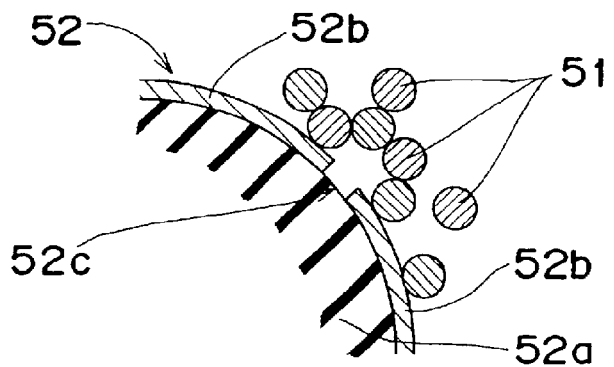
FIG. 3 is a diagram explanatory of the reason why an auxiliary conductive filler is not solely used in the touch panel of FIG. 1.
Figure 4:
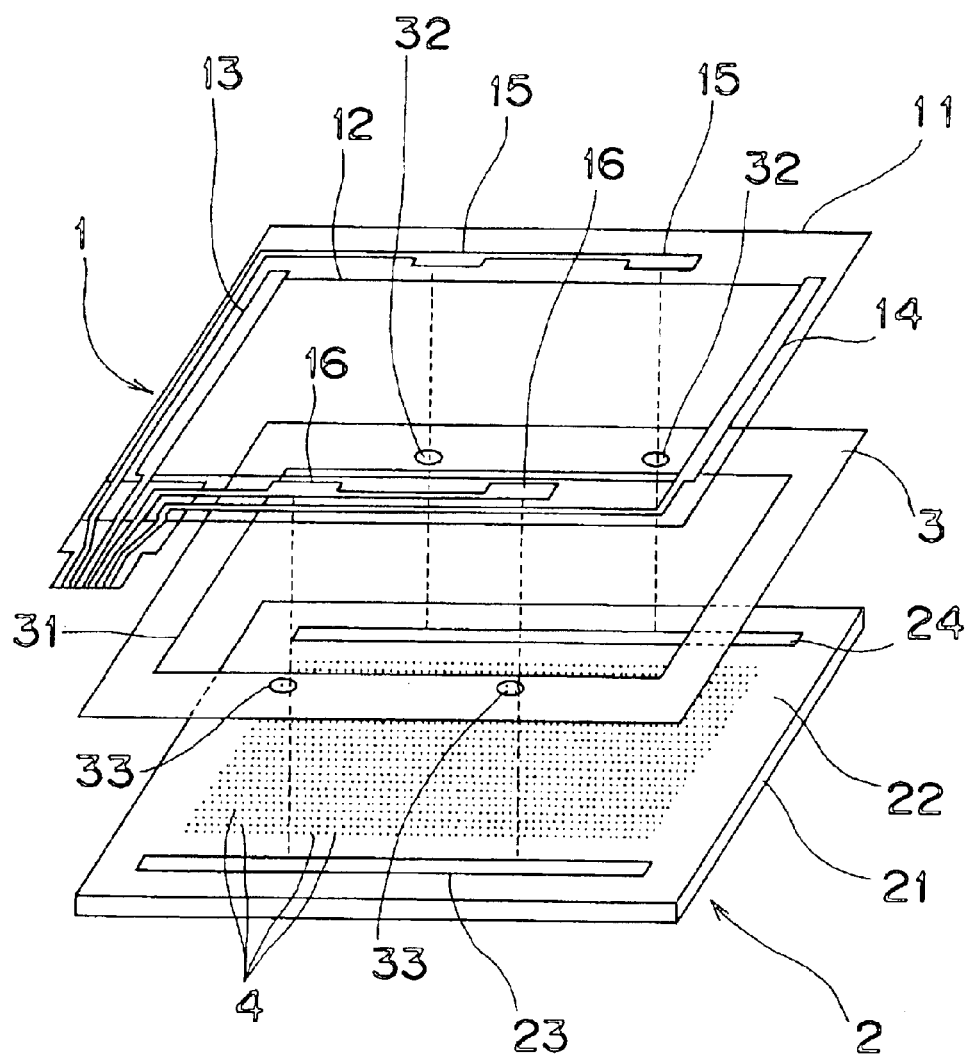
FIG. 4 is an exploded diagram of the touch panel of FIG. 1.
Figure 5:
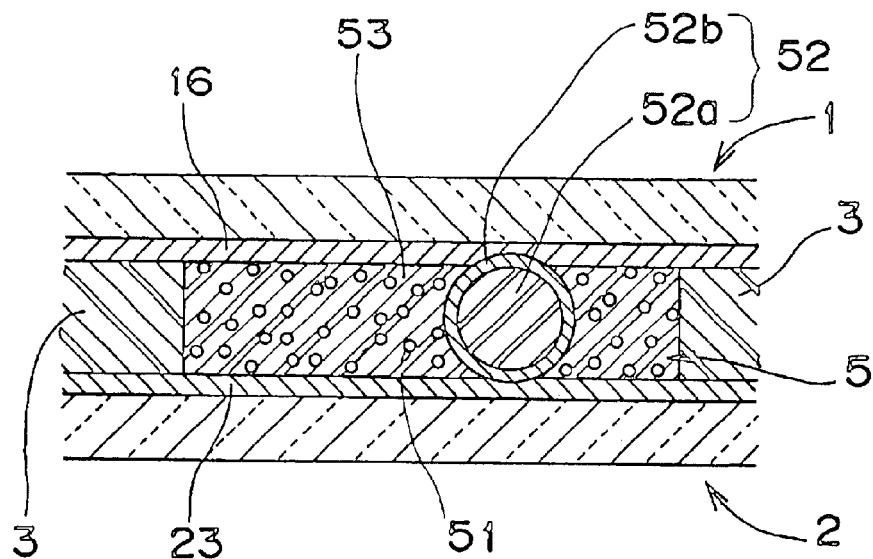
FIG. 5 is a diagram explanatory of electric connection of the touch panel in FIG. 1 by the conductive adhesive without a void.
Figure 6:
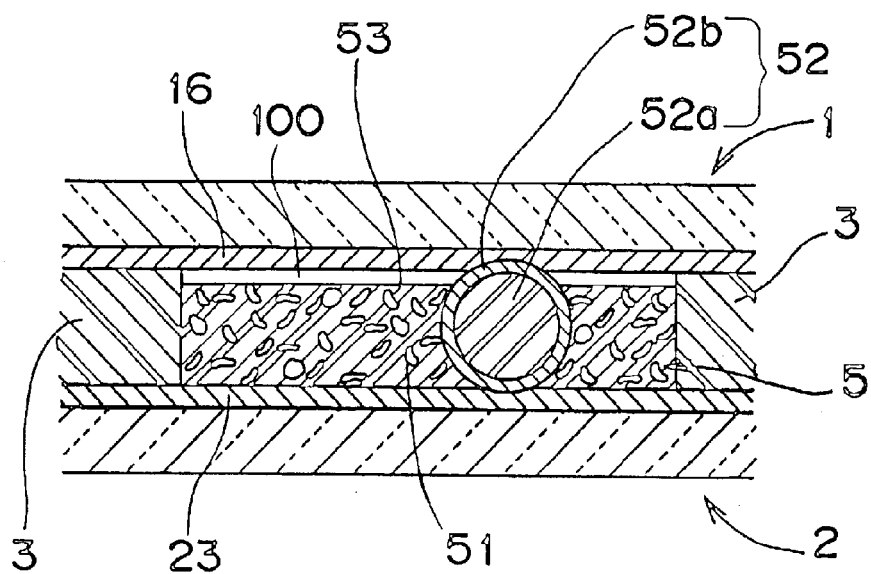
FIG. 6 is a diagram explanatory of electric connection of a touch panel according to an embodiment of the present invention by a conductive adhesive with a void caused by out gas and the main conductive fillers being flakes.
Figure 7:
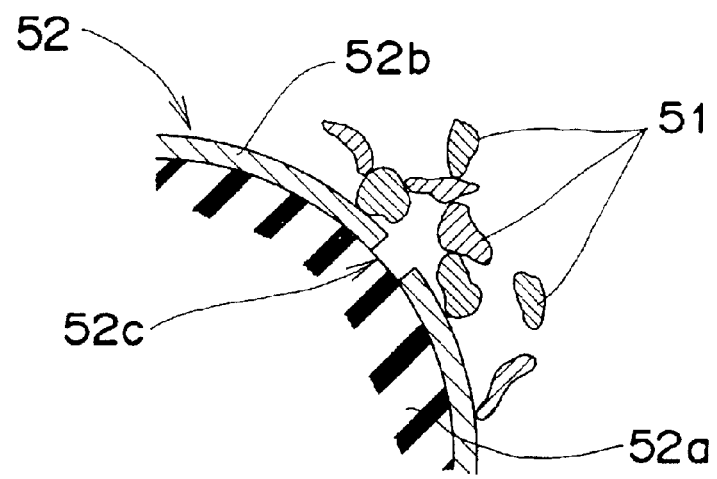
FIG. 7 is a diagram explanatory of the reason why an auxiliary conductive filler is not solely used in the touch panel of FIG. 6.
Figure 8:
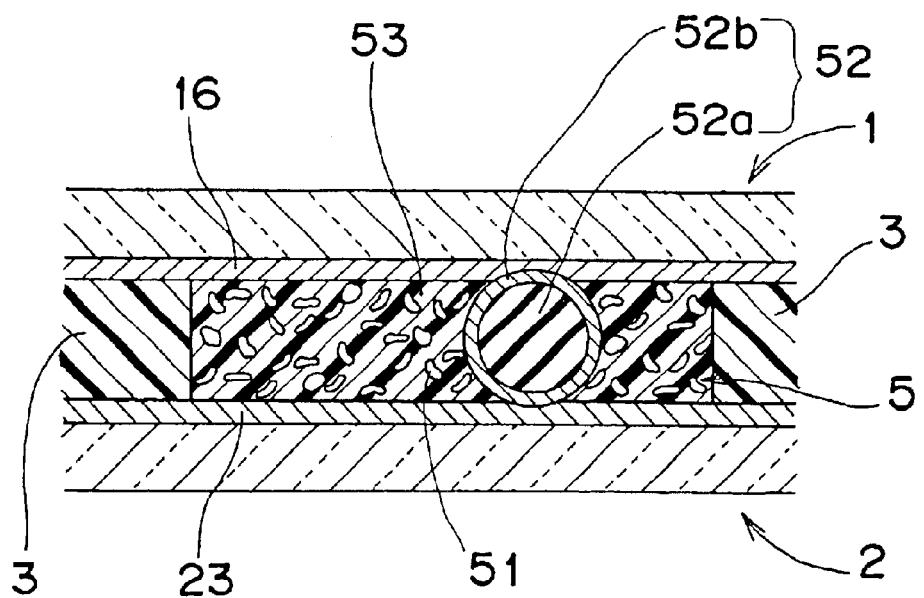
FIG. 8 is a diagram explanatory of electric connection of the touch panel of FIG. 6 by the conductive adhesive without a void.
Figure 9:
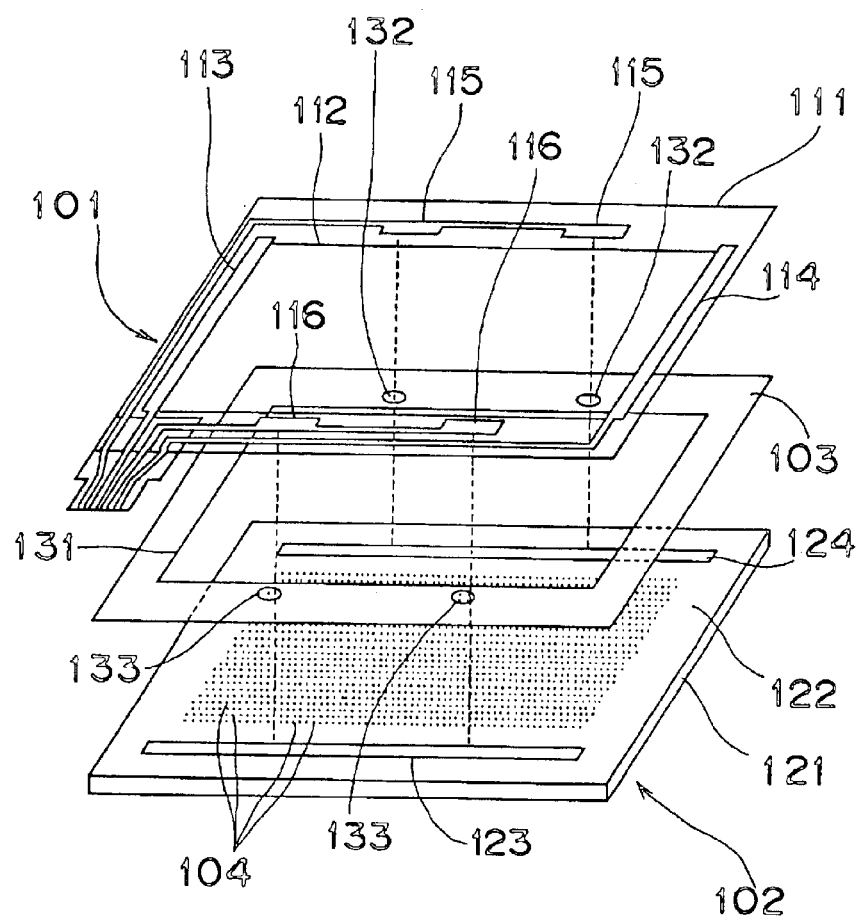
FIG. 9 is an exploded diagram of a touch panel according to the prior art.
Figure 10:
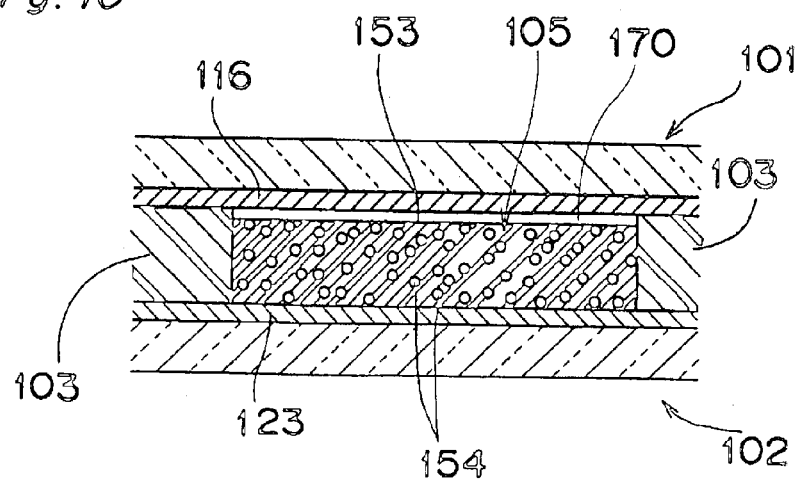
FIG. 10 is a diagram explanatory of electric connection by a conductive adhesive of the touch panel in FIG. 9.

FIG. 1 is a diagram explanatory of electric connection of the touch panel according to one embodiment of the present invention by conductive adhesives with a void being generated and main conductive fillers being spheres. FIGS. 2 and 3 are diagrams explanatory of the reason why an auxiliary conductive filler is not solely used. FIG. 4 is an exploded diagram of the touch panel of the embodiment. FIG. 5 is a diagram explanatory of electric connection of the touch panel according to the embodiment of the present invention by conductive adhesives with a void not being generated and the main conductive fillers being spheres. FIG. 6 is a diagram explanatory of electric connection of the touch panel according to the embodiment of the present invention by conductive adhesives with a void caused by out gas and the main conductive fillers being flakes. FIG. 7 is a diagram explanatory of the reason why an auxiliary conductive filler is not solely used. FIG. 8 is a diagram explanatory of electric connection of the touch panel according to the embodiment of the present invention by conductive adhesives with no void caused by out gas and the main conductive fillers being flakes. In the figures, reference numeral 1 denotes a touch side panel which is a panel disposed on a touch side of the touch panel, 11 denotes a transparent insulating base member, 12 denotes a transparent electrode, 13 and 14 denote lead electrodes, 15 and 16 denote connection electrodes, 2 denotes a base side panel which is a panel disposed on a base side of the touch panel, 21 denotes a transparent insulating base member, 22 denotes a transparent electrode, 23 and 24 denotes lead electrodes, 3 denotes a spacer, 31 denotes a space, 32 and 33 denote through holes, 4 denotes a dot-shaped spacer, 5 denotes a conductive adhesive, 51 denotes a main conductive filler, 52 denotes an auxiliary conductive filler, 52a denotes a core material, 52b denotes a conductive layer, and 53 denotes a binder. The diagrams represent simplifying the touch panel in shape, size, disperse state of particles, etc. for easy understanding of the embodiment of the present invention.

As indicated in FIG. 4, the touch panel of an analog resistance film form includes in the touch side panel 1, the transparent electrode 12 at a central part of one face of the transparent insulating base member 11, and the lead electrodes 13, 14 at sides opposite to each other. The touch side panel 1 also has connection electrodes 15, 16 set to an insulating part outside the transparent electrode 12. The connection electrodes 15, 16 are formed in a state to be independent of the transparent electrode 12 and the lead electrodes 13, 14.

The base side panel 2 has the transparent electrode 22 at one face of the transparent insulating base member 21 and the lead electrodes 23, 24 on the transparent electrode. The transparent electrode 22 is set to the entire face of the transparent insulating base member 21. The lead electrodes 23, 24 are set in the vicinity of outer edges of opposed sides and are perpendicular to the lead electrodes 13, 14.

The touch side panel 1 and the base side panel 2 are arranged to face each other via the spacer 3 while the transparent electrodes 12, 22 are placed inside and moreover, the lead electrodes 13, 14, 23, 24 are stationed to plot a rectangular outline.

The spacer 3 in the form of a frame is capable of contacting the transparent electrode 12 at the touch side with the transparent electrode 22 at the base side through the internal space 31 when the touch panel is depressed and is capable of insulating the lead electrodes 13, 14 of the touch side and the lead electrodes 23, 24 of the base side from each other. The spacer 3 has through holes 32, 33 or notch parts. Part of each of the connection electrodes 15, 16 at the touch side and part of each of the lead electrodes 23, 24 at the base side are exposed through the through hole parts 32, 33 or notch parts, whereby the conductive adhesive 5 is inserted into the through hole parts 32, 33 of the spacer 3, and thus, each of the connection electrodes 15 at the touch side can be connected by the conductive adhesive 5 to the corresponding part of the lead electrodes 24 of the base side while each of the connection electrodes 16 at the touch side can be connected by the conductive adhesive 5 to the corresponding part of the lead electrodes 23 of the base side. In addition to the spacer 3 of the frame form, the dot-shaped spacers 4 are also formed to a surface of the transparent electrode 22 of the base side.

The conductive adhesive 5 used for connecting the part of each of the connection electrodes 15, 16 of the touch side to the part of each of the lead electrodes 23, 24 of the base side is made up of the main conductive fillers 51 of flakes (See FIGS. 6–8) or spheres (See FIGS. 1–3, 5) of a particle size (longest diameter in flakes) of 1–20 $\mu$m or short fibers of a length of 1–20 $\mu$m, and the spherical auxiliary conductive filler 52 of a larger particle size by 10–100 $\mu$m than a minimum distance between contact faces of the electrodes, which are dispersed in the binder 53, as shown in FIG. 1 (also see FIGS. 5, 6, and 8). The insulating core material 52a of the auxiliary conductive filler is coated with the conductive layer 52b. The auxiliary conductive filler 52 is always held in touch with the lead electrodes 23, 24 and the connection electrodes 15, 16.

The constitution illustrated in FIG. 4 may be switched between the touch side panel 1 and the base side panel 2. In other words, a constitution is possible in which the transparent electrode 12 is set to the total face of the transparent insulating base member 11 of the touch side panel 1, the transparent electrode 22 is set to part of the transparent insulating base member 21 of the base side panel 2 and connection electrodes to be connected to the lead electrodes 13, 14 of the touch side panel 1 are arranged at an insulating part other than the transparent electrode 22. The dot-shaped spacers 4 shown in FIG. 4 can be omitted or formed to a surface of the transparent electrode 12 of the touch side.

For the transparent insulating base member 11 of the touch side panel, flexibility is needed for inputs and therefore, a transparent film of polycarbonate, polyamide, polyether ketone or the like engineering plastic, acryl, polyethylene terephthalate, polybutylene terephthalate, or the like; or a laminate of the films is used. A hard coat layer may be provided to an opposite face to the face of the transparent insulating base member of the touch side panel where the transparent electrode is set. For the hard coat layer, an inorganic material such as siloxane resin or the like, or an organic material such as acryl epoxy, urethane or the like thermosetting resin, acrylate thermosetting resin or the like is used. A thickness of the hard coat layer is preferably approximately 1–7 $\mu$m. Or the transparent insulating base member of the touch side panel, specifically, the face opposite to the face where the transparent electrode is set may be processed by an anti-glare treatment so as to prevent light reflection. For instance, the transparent insulating base member or the hard coat layer is processed to be rough, or fine particles of an extender, silica, alumina or the like are blended in the hard coat layer, or the like.

On the other hand, for the transparent insulating base member 21 of the base side panel 2, not only a glass plate of soda glass, borosilicate glass, tempered glass or the like, but a transparent resin plate, transparent film or its laminate of polycarbonate, polyamide, polyether ketone or the like engineering plastic, acryl, polyethylene terephthalate, polybutylene terephthalate or the like can be used.

The transparent insulating base members of the touch side panel and the base side panel may be equipped with a different optical function or the like as well as a function as a supporting body for the transparent electrodes. For example, in the case where the touch panel includes a reflection-preventing filter of a circular polarization type, as disclosed in Japanese Patent Unexamined Publication No. 10-48625, because of the constitution of the touch panel having at least a first quarter-wave plate, two transparent electrodes opposed to each other via a spacer, a second quarter-wave plate having an optical axis orthogonal to that of the first quarter-wave plate, and a polarizing plate arranged in an order from the liquid crystal display side, the first quarter-wave plate may be used as the transparent insulating base member of the base side panel and the second quarter-wave plate may be utilized as the transparent insulating base member of the touch side panel. The quarter-wave plate applies a phase shift in time (phase difference) to polarized lights of two components decomposed from a linearly polarized light and orthogonal to each other, thereby functioning to change the linearly polarized light to a circularly polarized light or a nearly circularly polarized light. The quarter-wave plate of a transparent resin plate or transparent film has a function of delaying one polarized light in phase by a ¼ wavelength to an incident light of a center wavelength (approximately 550 nm) of a visible light range (approximately 400–700 nm).

According to the embodiment of the present invention, the transparent electrode 12, 22 is an area exerting continuity before the spacer 3 and the dot-shaped spacers 4 are formed among the transparent conductive films formed on the transparent insulating base members 11, 21 of the touch side panel and the base side panel. More specifically, in the touch panel of the embodiment of the present invention having the connection electrodes in which either one of the touch side panel and the base side panel has the transparent electrode set to the whole face of the transparent insulating base member and the other has the transparent electrode set to part of the transparent insulating base member, as a combination type of the touch side panel and the base side panel. That is, in the transparent conductive film having a partial transparent insulating base member, the transparent conductive film is formed only partially on the transparent insulating base member, thereby obtaining the transparent electrode, or part of the transparent conductive film is left and insulated to make a non-insulating part the transparent electrode. As a specific means, a method of removing an unnecessary transparent conductive film by etching a resist after forming the transparent conductive film to the whole face, a method of forming the transparent conductive film in a pattern with the use of a metal mask or the like, a method of coating a part not requiring conductivity with an insulating material after forming the transparent conductive film to the whole face, or the like is carried out. Meanwhile, for a material of the transparent conductive film, a metallic oxide film of tin oxide, indium oxide, antimony oxide, zinc oxide, cadmium oxide, indium tin oxide (ITO), or the like; a composite film essentially consisting of the metallic oxides; or a metallic film of gold, silver, copper, tin, nickel, aluminum, palladium, or the like is used. The transparent conductive film can be formed in multi layers. Vacuum deposition, sputtering, ion plating, CVD or the like method is employed to form the transparent conductive film.

For the lead electrodes and the connection electrodes, a metal such as gold, silver, copper, nickel, or the like, or a conductive paste such as carbon or the like is used. The lead electrodes and the connection electrodes are formed by printing such as screen printing, offset printing, gravure printing, flexography, or the like; application by a brush or the like after the transparent electrodes are set as above.

The touch panel is generally connected to an external circuit via a connector, having lead wires led from the lead electrodes and the connection electrodes to input/output terminals of the touch panel.

The spacer 3 is shaped in a form so that the lead electrodes in the rectangular arrangement can be insulated between the touch side panel and the base side panel, for example, shaped in the form of a frame. The spacer 3 can be formed by applying a similar resin film to one used for the transparent insulating base members, or printing or coating an appropriate resin such as acrylic resin, epoxy resin, silicone resin, or the like. In general, an adhesive layer formed of a double-coated tape, an adhesive, or a self-adhesive in the form of a frame for fixing the touch side panel and the base side panel often serves also as the spacer 3. In forming the adhesive layer of an adhesive or self-adhesive, screen printing or the like manner is employed. A thickness of the spacer 3 is generally 15–200 µm. Since the auxiliary conductive fillers 52 such as resin beads has larger particle size by 10–100 µm than a minimum distance of contact faces of the electrodes, the diameter of each of the beads of the auxiliary conductive fillers 52 is 25–300 µm. The flakes or spheres of the main conductive fillers 51 have a particle size of 1–20 µm. Then, the ratio of the above size of the main conductive filler 51 to that of the auxiliary conductive filler 52 is calculated to obtain ⅟300 through ²⁰⁄₂₅. Since the auxiliary conductive filler 52 is required to be generally covered with the main conductive fillers 51, it is necessary that the size of each of the main conductive fillers 51 is a half or less of that of the auxiliary conductive fillers 52, and then, the size of each of the main conductive fillers 51 is, preferably, ⅟300 to ½ of that of the auxiliary conductive filler 52.

The dot-shaped spacers 4 are formed to secure a space between the transparent electrodes of the touch side and the base side in a case where a large-scale touch panel or the like is produced. The dot-shaped spacers 4 can be obtained by forming, for instance, an acrylate resin such as melamine acrylate resin, urethane acrylate resin, epoxy acrylate resin, methacryl acrylate resin, acryl acrylate resin, or the like, or a transparent photosetting resin such as polyvinyl alcohol resin or the like into fine dots in a photoprocess. The spacers 4 can be obtained also by forming fine dots in a printing process. The spacers 4 can be obtained also by spraying or applying a disperse solution of particles of an inorganic or organic substance and then drying it. In the case where the transparent electrode is formed to part of the transparent insulating base member by coating the part requiring no conductivity with the insulating material after the transparent conductive film is formed all over the face, using the photoprocess referred to above enables simultaneous formation of the insulating coat and the dot-shaped spacers.

A thermosetting resin or thermoplastic resin similar to in conventionally known conductive adhesives may be appropriately used as the binder 53 of the conductive adhesive 5. The thermosetting resin is, for instance, epoxy resin, phenol resin, acryl resin, urethane resin, silicon resin, or the like. The thermoplastic resin is, e.g., polyamide, polyethylene, polystyrene, polyester, polyurethane, ethylene-vinyl acetate copolymer, ethylene-ethyl acrylate copolymer, or the like.

The main conductive fillers 51 of the conductive adhesive 5 serve to provide continuity in the adhesive through contact between the main conductive fillers 51, similar to conventional conductive fillers, in the case without lifting of the conductive adhesive 5 as shown in FIG. 5 (also see FIG. 8). In the presence of lifting of the conductive adhesive 5 as shown in FIG. 1 (also see FIG. 6) by generating a void 100, the auxiliary conductive filler 52 assists the main conductive fillers 51 to provide continuity, in other words, continuity in the adhesive can be provided by the auxiliary conductive filler 52. Each of the main conductive fillers 51 is composed of flakes or spheres of a particle size of 1–20 $\mu$m or short fibers of a length of 1–20 $\mu$m. A material for the main conductive filler 51 is a conductive metallic powder of silver, gold, copper, nickel, platinum, palladium, or the like; one in which a surface of a core material of an inorganic insulator of alumina, glass, or the like or an organic polymer of polyethylene, polystyrene, divinylbenzene, or the like is coated with a conductive layer of gold, nickel, or the like; carbon; graphite; or the like.

The viscosity of the conductive adhesive 5 ranges from 100 Poise to 600 Poise, preferably. In consideration of dispensability, screen printing performance, and dispersibility of the auxiliary conductive fillers 52 in the conductive adhesive 5, it is preferable that the viscosity of the conductive adhesive 5 ranges from 200 Poise to 400 Poise. If smaller than 100 Poise, the conductive adhesive easily runs, causing coating problems, and the dispersed auxiliary conductive fillers 52 are easily settled. If higher than 600 Poise, the conductive adhesive is too hard to coat, causing coating problems, and it is difficult to agitate the conductive adhesive to disperse the auxiliary conductive fillers 52 therein. In this case, the auxiliary conductive fillers (beads) 52 has a specific gravity of about 1–5, preferably 1–3 in consideration of dispersibility of the auxiliary conductive fillers 52 in the conductive adhesive 5. If the specific gravity is smaller than 1, the auxiliary conductive fillers 52 easily float in the conductive adhesive 5. If the specific gravity is higher than 5, the auxiliary conductive fillers 52 are easily settled in the conductive adhesive 5.

It is necessary to include the main conductive fillers 51 by 20–80 wt % to the conductive adhesive 5 at the formation of ink. When the content of the main conductive fillers 51 is smaller than 20 wt %, a resistance loss at a connection part increases. On the other hand, when the content of the main conductive fillers 51 exceeds 80 wt %, a viscosity increases and consequently a flexibility becomes poor to make the conductive adhesive hard to form the ink. The flexibility is necessary to the conductive adhesive 5 to stand a certain level of stress.

Preferably, the main conductive fillers 51 of the conductive adhesive 5 are flakes of silver powder, because silver has a lower specific resistance than copper or the like, so that the conductive adhesive formed of the main conductive fillers 51 of silver of a relatively small content can be easily reduced in resistance and lowered in viscosity. The shape of the main conductive fillers 51, namely the flake, increases a contact area of the main conductive fillers 51 contacting each other and a contact area of the auxiliary conductive fillers 52 contacting the main conductive fillers 51.

The auxiliary conductive fillers 52 of the conductive adhesive 5 intend to keep connection between the lead electrodes and the connection electrodes at all times and avoid a connection failure even if lifting takes place between the lead electrodes and the conductive adhesive and/or between the connection electrodes and the conductive adhesive. A spherical one having the insulating core material 52a coated with the conductive layer 52b and a larger particle size by 10–100 $\mu$m than a minimum distance of contact faces of the electrodes is used as the auxiliary conductive filler 52. The insulating core material 52a can be an inorganic insulator of alumina, glass, or the like; or an organic polymer of polyethylene, polystyrene, divinylbenzene, or the like, or the like. The conductive layer 52b can be formed of gold, nickel, or the like. Plating, coating or the like is carried out to coat the conductive layer 52b.

In comparison with the minimum distance between the contact faces, that is, between the connection electrode and the lead electrode connected by the conductive adhesive 5, the particle size of the auxiliary conductive filler 52 should be larger by 10 $\mu$m or more. Unless the particle size is this much larger, the auxiliary conductive filler 52 itself separates from the connection electrode or the lead electrode connected in the occurrence of the void 100 caused by lifting of the conductive adhesive 5 at the connection part, which is feared to result in a connection failure as shown in FIG. 1 (also see FIG. 6). When the particle size of the auxiliary conductive filler 52 is larger by 100 $\mu$m or more than the minimum distance between the contact faces of the electrodes, the connection part alone abnormally swells, whereby the touch side panel or both side panels are distorted up to a panel visible area, impairing an appearance.

Each of the auxiliary conductive fillers 52 is formed in the spherical shape, because the spherical filler surely brings the lead electrodes 23, 24 and the connection electrodes 15, 16 in touch with each other owing to the nearly same size in lengthwise and breadthwise directions and thicknesswise direction thereof in whichever state the auxiliary conductive fillers 52 are dispersed in the conductive adhesive 5. For instance, if the auxiliary conductive fillers 52 is shaped like flakes, the auxiliary conductive fillers 52 becomes considerably smaller in size in the thicknesswise direction than in the lengthwise and breadthwise directions, whereby the lead electrodes 23, 24 are sometimes not surely in touch with the connection electrodes 15, 16 depending on its disperse state.

The reason why each of the auxiliary conductive fillers 52 is made up of the core material 52a and the conductive layer 52b is that each of the auxiliary conductive fillers 52 has the larger particle size than the minimum distance of the electrode contact faces by 10–100 $\mu$m. In the case of the conductive filler of a large particle size as in the present embodiment, the conductive adhesive 5 becomes expensive if each of the conductive fillers is made up of the conductive material totally. In contrast, the conductive adhesive 5 is inexpensive even with use of gold, silver, or the like if merely a surface of the auxiliary conductive filler 52 is made up of the conductive material of a small quantity.

When the auxiliary conductive filler 52 has a surface of a core material of plastic real sphere coated with metallic plating of a conductive layer, the auxiliary conductive filler 52 can be easily deformed by a compressive load to perform the surface contact between the auxiliary conductive filler 52 and both of the lead electrodes and the connection electrodes. Thus, the surface contact can be ensured between the auxiliary conductive filler 52 and both of the lead electrodes and the connection electrodes which is different from point contact therebetween, resulting in making the contact resistance stable. When the area of the surface contact is a value calculated based on about 10–20% compressed diameter of the bead, the area of each of the contact surfaces at the bottom and the top surfaces might be a value of the about 19–36% maximum sectional area of the bead based on the following equation: $X^2=50^2-45^2=475$ (with 100 $\mu$m diameter bead compressed by 10%). Then, $X=21.8$. Then, the area is calculated by $21.8 \times 21.8 \times \pi$ as compared with a case where the maximum sectional area of the bead is calculated by 50×50×π, resulting in about 19% reduction of the area between the contact area at each of the top and bottom surfaces and the maximum sectional area.

The auxiliary conductive fillers 52 are not solely included in the conductive adhesive 5, but are included together with the main conductive fillers 51 in the conductive adhesive 5. The reason for this is as follows. As described above, each of the auxiliary conductive fillers 52 has the insulating core material 52a coated with the conductive layer 52b and 10–100 μm larger particle size than the minimum distance of the contact faces of the electrodes, and therefore a crack 52c or separation is easy to generate to the conductive layer 52b as indicated in FIG. 2 because of a force caused in a solidification stabilization process when the touch side panel 1 and the base side panel 2 are bonded. Since the main conductive fillers 51 adhere to and cover the surface of the auxiliary conductive filler 52 even in this case, continuity is ensured via the main conductive fillers 51 (with reference to FIGS. 3 and 7).

In consideration of a dispersibility of the auxiliary conductive fillers 52 in the conductive adhesive 5, the auxiliary conductive fillers 52 are preferably included by 0.5–30 wt % to the conductive adhesive 5 when formed into ink. At the formation of ink, 0.5 wt % or more auxiliary conductive fillers 52 is required so that at least one or more auxiliary conductive fillers 52 are included in the conductive adhesive 5 of each connection part. If the content is smaller than 0.5 wt %, not a single auxiliary conductive filler 52 is present at each connection part in some cases. When the content of the auxiliary conductive fillers 52 exceeds 30 wt %, a resilience force to the electrodes by a self elasticity of the auxiliary conductive fillers 52 increases, a bond strength of the conductive adhesive itself decreases, and the viscosity becomes too high, etc.

More preferably, the auxiliary conductive filler 52 of the conductive adhesive 5 has the conductive layer 52b coated with gold. The auxiliary conductive filler 52 having the gold-coated surface shows a good dispersibility to the binder and the conductive layer 52b is rendered superior in conductivity and mechanical strength.

That is, a specific gravity of the auxiliary conductive filler of a 100 μm diameter bead as one example is 1.43 which is very small as compared with fillers consisting of gold and having a specific gravity of about 19. In Addition, since the metallic plating is performed on the plastic particle, a real sphere can be obtained through polymerization as compared with a sphere consisting of metal. Thus, the auxiliary conductive fillers do not settle in the binder having a relatively high viscosity and show a good dispersibility to the binder. Specifically, the auxiliary conductive filler of a 100 μm diameter sphere of 1.43 specific gravity is mixed in the conductive adhesive by 1.5 wt %, and agitated, and thereafter, applied in a spot shape of a 1 mm diameter area by a dispenser. In this case, on the average of ten beads, and at least three beads of the auxiliary conductive fillers are dispersed in the area without coagulation.

Various additives such as a setting accelerator, a flame retardant, a leveling agent, an anti-settling agent, a coupling agent, an antifoamer, an adhesion application agent, and the like can be used in the conductive adhesive 5.

In the above-described touch panel, even if lifting takes place due to an out gas generated when the conductive adhesive is set between the lead electrodes and the conductive adhesive and/or between the connection electrodes and the conductive adhesive, or if lifting takes place similarly due to a stress of thermal expansion or thermal shrinkage to the touch side panel and the base side panel at an environment resistance test, as is clear in FIG. 1 (also see FIG. 6), at least one of the auxiliary conductive fillers 52 included together with the main conductive fillers 51 in the binder 53 of the conductive adhesive 5 maintains connection between the lead electrodes 23, 24 and the connection electrodes 15, 16 at all times, thereby preventing a connection failure.

A first example of the embodiment is described below.

An ITO film is formed by vacuum deposition to one entire face of a transparent insulating base member of soda glass, which serves as a transparent electrode. Fine dot-shaped spacers are obtained on the ITO film in a photoprocess using an epoxy acrylate photosetting resin. Further, a pair of parallel lead electrodes are formed on the transparent electrode by screen printing with using silver ink. A base side panel is thus obtained.

In the meantime, an acrylic hard coat of a type set by ultraviolet rays is applied by a roll coater to one face of a flexible transparent insulating base member of a polyethylene terephthalate film of a roll, and an ITO film is formed entirely to an opposite face by sputtering, whereby an ITO film with a hard coat is obtained. After the roll film is cut to a sheet, an etching resist is applied in a pattern onto the ITO film by screen printing, and an unnecessary part of the ITO film is removed by hydrochloric acid, whereby a rectangular transparent electrode is formed. The etching resist is removed by an alkali solution after the etching. Lead electrodes are formed to both sides of the transparent electrode by screen printing using silver ink. Simultaneously with this, connection electrodes are formed by screen printing using silver ink to correspond to part of the lead electrodes of the base side panel. A touch side panel is obtained in this manner.

A double-coated tape of a thickness of 60 μm from which a part corresponding to a panel visible area and a part on the connection electrodes where a conductive adhesive is to be applied are cut off is bonded as a spacer to the face of the touch side panel where the transparent electrode is formed. An ink of the conductive adhesive dispersed in a silicon resin is applied by a dispenser to the part on the connection electrodes without the double-coated tape. The conductive adhesive is a mixture of a main conductive fillers of flakes of silver powder of a particle size of 10 μm and a spherical auxiliary conductive filler of a particle size of 110 μm in the binder of silicon resin. The main conductive fillers are mixed by 50 wt % and the auxiliary conductive filler are mixed by 2.0 wt % in the binder of the silicon resin. The auxiliary conductive fillers include crosslinking copolymer resin beads essentially made up of insulating divinylbenzene and each coated with a conductive layer of gold by plating.

The touch side panel and the base side panel are arranged to face each other while the transparent electrodes are placed inside and the lead electrodes of both side panels are disposed in a rectangular arrangement. Parts of the double-coated tape in the periphery are pressured by rollers.

After the bonding, the conductive adhesive is set in an oven at 130° C., whereby a touch panel is obtained.

The thus-obtained touch panel includes at least one or more auxiliary conductive fillers at each connection part between the connection electrodes and the lead electrodes. Therefore, a connection failure resulting from lifting by an out gas generated when the conductive adhesive is processed to be set never takes place. Even 1000 hours later under a high-temperature and high-humidity environment (60° C., 90% RH) at an environment resistance test, no connection failure because of a stress of thermal expansion or thermal shrinkage or the like of the touch side panel and the base side panel occurs.

A second example of the embodiment is described below.

An ITO film is formed by vacuum deposition to one entire face of a transparent insulating base member of polycarbonate, which serves as a transparent electrode. Fine dot-shaped spacers are obtained on the ITO film in a screen printing using a transparent resin of polyestel resin. Further, a pair of parallel lead electrodes are formed on the transparent electrode by screen printing with using silver ink. A base side panel is thus obtained.

In the meantime, an acrylic hard coat of a type set by ultraviolet rays is applied by a roll coater to one face of a flexible transparent insulating base member of a polyethylene terephthalate film of a roll, and an ITO film is formed entirely to an opposite face by sputtering, whereby an ITO film with a hard coat is obtained. After the roll film is cut to a sheet, an etching resist is applied in a pattern onto the ITO film by screen printing, and an unnecessary part of the ITO film is removed by hydrochloric acid, whereby a rectangular transparent electrode is formed. The etching resist is removed by an alkali solution after the etching. Lead electrodes are formed to both sides of the transparent electrode by screen printing with using silver ink. Simultaneously with this, connection electrodes are formed by screen printing using silver ink to correspond to part of the lead electrodes of the base side panel. Conductive paste of epoxy resin is printed in 2 mm rectangular shape on a part of each of the connection electrodes, and then temporarily dried by heating at 100° C. in 30 minutes. A touch side panel is obtained in this manner. The conductive adhesive is a mixture of a main conductive fillers of silver powder of spheres of a particle size of 5 $\mu$m and a spherical auxiliary conductive filler of a particle size of 75 $\mu$m in the binder of epoxy resin. The main conductive fillers are mixed by 70 wt % and the auxiliary conductive filler are mixed by 1.0 wt % in the binder. The auxiliary conductive fillers include crosslinking copolymer resin beads essentially made up of insulating divinylbenzene and each coated with a conductive layer of gold by plating.

A double-coated tape of a thickness of 60 $\mu$m from which a part corresponding to a panel visible area and a part on the connection electrodes where the conductive adhesive is applied are cut off is bonded as a spacer to the face of the touch side panel where the transparent electrode is formed.

Next, the touch side panel and the base side panel are arranged to face each other while the transparent electrodes are placed inside and the lead electrodes of both side panels are disposed in a rectangular arrangement. Parts of the double-coated tape in the periphery are pressured by rollers.

After the bonding, the conductive adhesive is pressed at 140° C. by a pressure of 3 kg/cm$^2$ during 15 seconds for perfect setting, whereby a touch panel is obtained.

The thus-obtained touch panel includes at least one or more auxiliary conductive fillers at each connection part between the connection electrodes and the lead electrodes. Therefore, a connection failure resulting from lifting by an out gas (volatile solvent) generated when the conductive adhesive is processed to be set never takes place. Even 1000 hours later under a high-temperature and high-humidity environment (60° C., 90% RH) at an environment resistance test, no connection failure because of a stress of thermal expansion or thermal shrinkage or the like of the touch side panel and the base side panel occurs.

For detecting an effect of the auxiliary conductive fillers 52, there are prepared two kinds of touch panels: one of the touch panel having the auxiliary conductive fillers 52 according to the embodiment, and the other of the touch panel having no auxiliary conductive fillers according to the prior art. Four sides of each of the touch panels are supported by a frame-shaped jig and then 3 kgf load is applied to a center portion of the touch panel by a compressing machine to bend the touch panel downwardly. Then, while a resistance value between the touch side panel and the base side panel at terminals of the touch panel is measured, the touch panel is bent as described above. At that time, deflection range of the resistance values is detected. Thus, the maximum deflection range of the resistance values at the touch panel having the auxiliary conductive fillers 52 according to the embodiment is ±1 $\Omega$ or less. The maximum deflection range of the resistance values at the touch panel having no auxiliary conductive fillers according to the prior art is ±5 $\Omega$. Therefore, since a stress caused at the connection parts of the touch panel by bending the touch panel can be relaxed or eased by the self elasticity of the auxiliary conductive fillers 52, the resistance value at the connection parts can be stabilized.

As described above, the high-reliability touch panel according to the present invention is constituted and operates as described hereinabove, thus exerting the following effects.

According to the present invention, the auxiliary conductive filler included together with the main conductive fillers in the binder of the conductive adhesive keeps connection between the lead electrodes and the connection electrodes at all times. In consequence of this, even if the out gas generated when the conductive adhesive is set causes lifting between the lead electrodes and the conductive adhesive and/or between the connection electrodes and the conductive adhesive or even if the stress of thermal expansion or thermal shrinkage or the like of the touch side panel and the base side panel at the time of an environment resistance test causes similar lifting, a connection failure is avoided. The present invention is much higher in reliability than conventional touch panels.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A touch panel manufacturing method comprising:

arranging a flexible touch side panel and a base side panel to face each other via an insulating spacer in an analog resistance film form, a transparent electrode and a pair of parallel lead electrodes being provided onto one face of a transparent insulating base member of each of the panels in a state with the transparent electrode set inside and the lead electrodes of one of the panels disposed in a rectangular arrangement along with the lead electrodes of the counterpart panel, either one of the touch side panel and the base side panel having the transparent electrode set to an entire face of the transparent insulating base member thereof, the other having the transparent electrode set to part of the transparent insulating base member thereof and including, at an insulating part other than the transparent electrode, independent connection electrodes; and connecting, via a conductive adhesive, the connection electrodes set to one of the panels to the lead electrodes set to the opposing panel, the conductive adhesive being made up of main conductive fillers of flakes or spheres or short fibers, and a spherical auxiliary conductive filler having an insulating core material coated with a conductive layer and having a larger particle size by 10–100 μm than a minimum distance of contact faces of the lead electrode of one of the panels and the connection electrode of the other of the panels connected by the conductive adhesive, both of the main conductive fillers and the auxiliary conductive filler dispersed in a binder of the conductive adhesive, whereby always keeping the auxiliary conductive filler in touch with the lead electrode of the one of the panels and the connection electrode of the other panels.

2. A touch panel manufacturing method according to claim 1, wherein a size of each of the main conductive fillers is 1/300 to 1/2 of that of the auxiliary conductive filler.

3. A touch panel manufacturing method according to claim 1, wherein the main conductive fillers comprises flakes or spheres of a particle size of 1–20 μm or short fibers of a length of 1–20 μm.

4. A touch panel manufacturing method according to claim 1, wherein the main conductive fillers comprise flakes of silver powder.

5. A touch panel manufacturing method according to claim 1, wherein the core material comprises an insulating resin core material as the core material, and wherein the conductive layer comprises gold.

6. A touch panel manufacturing method according to claim 1, wherein a content of the auxiliary conductive filler in the conductive adhesive when formed into an ink is 0.5–30 wt % to the conductive adhesive.

7. A touch panel manufacturing method according to claim 1, where in connecting, via the conductive adhesive, the connection electrodes set to one of the panels to the lead electrodes set to the opposing panel, the conductive adhesive is inserted into through hole parts of the spacer to connect the connection electrodes set to one of the panels to the lead electrodes set to the opposing panel.

8. A touch panel manufacturing method according to claim 1, wherein viscosity of the conductive adhesive ranges from 100 Poise to 600 Poise, and wherein a plurality of the auxiliary conductive fillers having a specific gravity of 1–5.

9. A touch panel comprising:

a flexible touch side panel;

an insulating spacer in an analog resistance film form;

a base side panel arranged to face said flexible touch side panel via said insulating spacer;

a first transparent insulating base member associated with said flexible touch side panel;

a first transparent electrode provided onto a face of said first transparent insulating base member;

a first pair of parallel lead electrodes provided onto the face of said first transparent insulating base member;

a second transparent insulating base member associated with said base side panel;

a second transparent electrode provided onto a face of said second transparent insulating base member;

a second pair of parallel lead electrodes provided onto the face of said second transparent insulating base member such that said first pair of parallel lead electrodes and said second pair of parallel lead electrodes have a rectangular arrangement;

independent connection electrodes provided onto one of said face of said first transparent insulating base member and said face of said second transparent insulating base member; and a conductive adhesive comprising a binder, main conductive fillers and a spherical auxiliary conductive filler, said main conductive fillers and said spherical auxiliary conductive filler being dispersed within said binder, wherein one of said first transparent electrode and said second transparent electrode covers the entirety of said face of said first transparent insulating base member and the entirety of said face of said second transparent insulating base member, respectively, wherein the other one of said first transparent electrode and said second transparent electrode covers a first area of said face of said first transparent insulating base member and a first area of said face of said second transparent insulating base member, respectively, bounded by the rectangular arrangement of said first pair of parallel lead electrodes and said second pair of parallel lead electrodes, wherein said independent connection electrodes are provided onto said one of said face of said first transparent insulating base member and said face of said second transparent insulating base member in which said other one of said first transparent electrode and said second transparent electrode covers, said independent connection electrodes are provided in an insulating part disposed outside of said first area, wherein said conductive adhesive is operable to connect said independent connection electrodes to one of said first pair of parallel lead electrodes and said second pair of parallel lead electrodes of said one of said first transparent electrode and said second transparent electrode, wherein said main conductive fillers comprises flakes, spheres or short fibers, wherein said spherical auxiliary conductive filler comprises an insulating core material coated with a conductive layer, wherein said spherical auxiliary conductive filler remains in contact with one of said independent connection electrodes and one of said lead electrodes of said one of said first pair of parallel lead electrodes and said second pair of parallel lead electrodes of said one of said first transparent electrode and said second transparent electrode, respectively, and wherein said spherical auxiliary conductive filler has a particle size that is larger, by 10–100 μm, than a minimum contact distance between said one of said independent connection electrodes and said one of said lead electrodes of said one of said first pair of parallel lead electrodes and said second pair of parallel lead electrodes of said one of said first transparent electrode and said second transparent electrode.

10. A touch panel according to claim 9, wherein a size of each of said main conductive fillers is 1/300 to 1/2 of that of said auxiliary conductive filler.

11. A touch panel according to claim 9, wherein the conductive adhesive is made up of the main conductive fillers of flakes or spheres of a particle size of 1–20 μm or short fibers of a length of 1–20 μm.

12. A touch panel according to claim 9, wherein said main conductive fillers comprise flakes of silver powder.

13. A touch panel according to claim 9, wherein said insulating core material comprises an insulating resin core material, and wherein said conductive layer comprises gold.

14. A touch panel according to claim 9, wherein a content of said auxiliary conductive filler in said conductive adhesive when formed into an ink is 0.5–30 wt % to said conductive adhesive.

15. A touch panel according to claim 9, wherein said spacer has through holes, into which said conductive adhesive is inserted to connect said independent connection electrodes to said one of said first pair of parallel lead electrodes and said second pair of parallel lead electrodes of said one of said first transparent electrode and said second transparent electrode, respectively.

16. A touch panel according to claim 9, wherein a viscosity of said conductive adhesive ranges for 100 Poise to 600 Poise, and wherein a plurality of said auxiliary conductive fillers have a specific gravity of 1–5.

* * * * *